United States Patent [19]

Huber et al.

[11] 4,274,752
[45] Jun. 23, 1981

[54] KEYBOARD MULTIPLE SWITCH ASSEMBLY

[75] Inventors: Daniel L. Huber; Thomas M. Paulson; James M. Williams, all of Lexington, Ky.

[73] Assignee: International Business Machines Corporation, Armonk, N.Y.

[21] Appl. No.: 25,825

[22] Filed: Apr. 2, 1979

[51] Int. Cl.³ ............................................. B41J 5/08
[52] U.S. Cl. ................................. 400/477; 400/479; 400/479.1; 400/491.2; 400/368; 200/5 R; 200/DIG. 1; 340/365 C
[58] Field of Search ............... 400/477, 479, 479.1, 400/491.2, 368, 485; 200/5 R, 5 A, 5 B, 5 C, 50 C, 67 A, DIG. 1; 340/365 R, 365 VA, 365 S, 365 C, 365 L, 365 P, 365 A, 365 E

[56] References Cited

U.S. PATENT DOCUMENTS

| | | | |
|---|---|---|---|
| T904,008 | 11/1972 | Crouse | 400/479.1 X |
| 3,210,484 | 10/1965 | Dorsey | 400/479 X |
| 3,240,885 | 3/1966 | Grunfelder et al. | 200/5 A |
| 3,300,600 | 1/1967 | Blomquist et al. | 200/50 C |
| 3,308,253 | 3/1967 | Krakinowski | 400/479 X |
| 3,584,162 | 6/1971 | Krakinowski | 400/479 X |
| 3,673,357 | 6/1972 | Molchan | 200/5 A |
| 3,696,908 | 10/1972 | Gluck et al. | 400/479.1 |
| 3,721,778 | 3/1973 | Seeger et al. | 200/5 R |
| 3,786,497 | 1/1974 | Davis et al. | 400/477 X |
| 3,856,998 | 12/1974 | Sims, Jr. | 200/5 A |
| 3,964,593 | 6/1976 | Pointon | 400/479 X |
| 3,969,595 | 7/1976 | Johnson | 200/5 A |
| 4,071,691 | 1/1978 | Pepper, Jr. | 340/365 C X |
| 4,117,292 | 9/1978 | Hayes et al. | 200/5 A X |
| 4,118,611 | 10/1978 | Harris | 200/67 A |

FOREIGN PATENT DOCUMENTS 1801696  4/1970  Fed. Rep. of Germany ...... 340/365 R

OTHER PUBLICATIONS

IBM Technical Disclosure Bulletin, "Repeating Code Transmitting Keyboard", Case, vol. 11 No. 8 Jan. 1969, pp. 1031-1032.
IBM Technical Disclosure Bulletin, "Dual-Force Automatic Rekeying", Fox, vol. 17 No. 1 Jun. 1974, pp. 164-165.
IBM Technical Disclosure Bulletin, "Key Button Module", Parks et al., vol. 20 No. 2 Jul. 1977, p. 463.
IBM Technical Disclosure Bulletin, "Electronic Keyboard Typamatic Key Module", Paulson et al., vol. 21 No. 1 Jun. 1978, pp. 244-245.
IBM Technical Disclosure Bulletin, "Multiposition Capacitive Selector Switch", Dobson et al., vol. 21 No. 1 Jun. 1978, pp. 246-247.
IBM Technical Disclosure Bulletin, "Adjustable Key Module", Bersot et al., vol. 21 No. 2 Jul. 1978, pp. 713-714.
IBM Technical Disclosure Bulletin, "Electronic Keyboard Module Housing", Hendren et al., vol. 21, No. 4 Sep. 1978, p. 1538.
IBM Technical Disclosure Bulletin, "Keyboard Beam/-Fly Spring Interlock", Huber et al., vol. 21 No. 5 Oct. 1978, p. 1938.
IBM Technical Disclosure Bulletin, "Electronic Keyboard Switch Mechanism", Young, vol. 21 No. 5 Oct. 1978, p. 1939.
IBM Technical Disclosure Bulletin, "Repeat Mechanism For Electronic Keyboard", Bushmiaer et al., pp. 1940-1941, vol. 21 No. 5 Oct. 1978.
IBM Technical Disclosure Bulletin, "Electronic Keyboard Noise Suppressor", Hendren et al., vol. 21 No. 6 Nov. 1978, p. 2389.
IBM Technical Disclosure Bulletin, "Keyboard High Pressure Electrical Connector", Huber et al., vol. 22 No. 3 Aug. 1979.

Primary Examiner—Ernest T. Wright, Jr.
Attorney, Agent, or Firm—John W. Girvin, Jr.

[57] ABSTRACT

An electronic switch keyboard for typewriters or office machines includes a multiple switch at selected key positions to provide two signal inputs to a utilization device. A first capacitor switch is actuated to provide a first signal upon initial key depression and a second contact switch, common to all selected key positions, is actuated to provide a second signal upon further key depression at the selected key positions. A ground plane forms a portion of the contact switch and further serves to reduce parasitic capacitance and to shield the capacitive switches from stray electrical noise occasioned by the contact switch or other electrical inputs. A dielectric material is used to accurately separate the ground plane from the capacitive switch and further serves as a force spreading device for the contact switch. When the keyboard is used in conjunction with a typewriter, the first signal may be used to effect character selection and printing and the second signal to effect repeated printing of the same character. Consistent with prior mechanical typewriter keyboards, three increasing levels of force are required to be overcome as the key is depressed: a pretravel force, a first switch actuation force, and a second switch actuation force.

8 Claims, 7 Drawing Figures

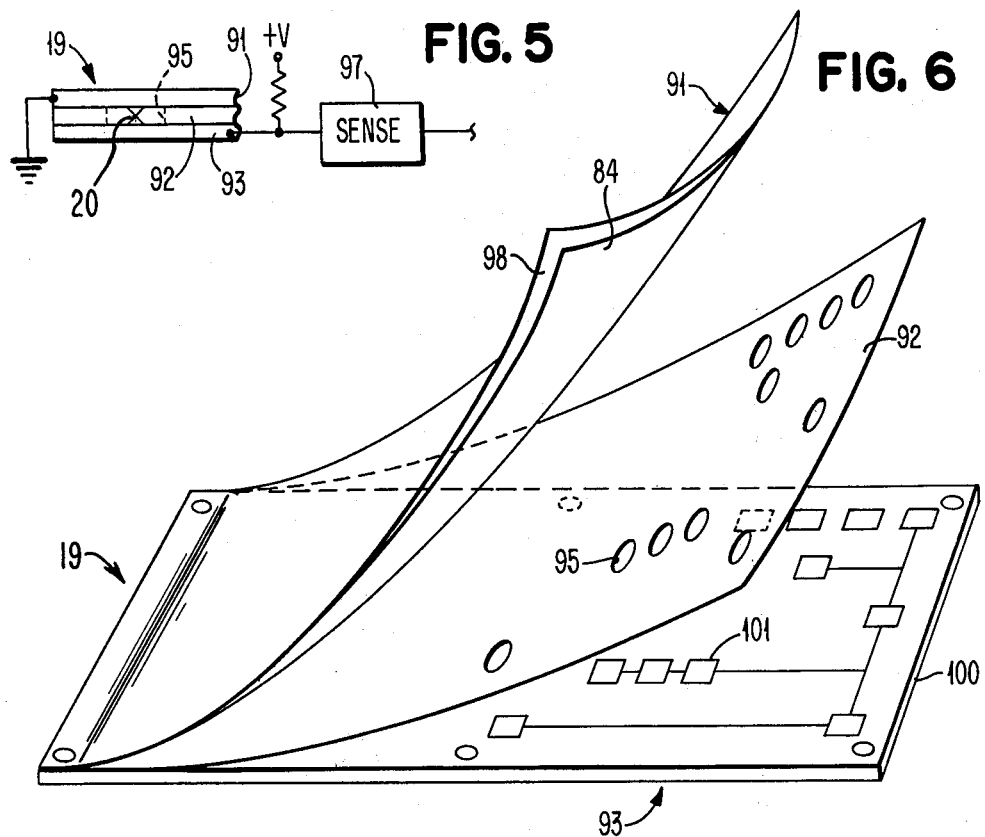
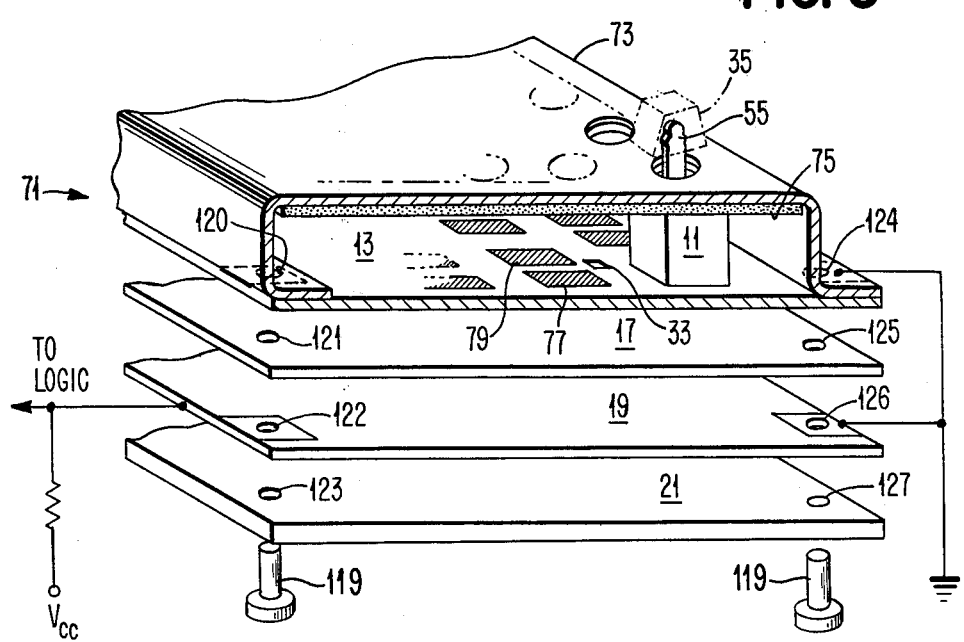

KEYBOARD MULTIPLE SWITCH ASSEMBLY

BRIEF BACKGROUND OF THE INVENTION

1. Field

This invention relates to a keyboard switch assembly and more particularly, to a key actuated multiple switch assembly.

2. Description of the Prior Art

Prior art mechanical keyboards used in typewriters have employed keys which, when depressed with a first force level, effect print actuation and which when depressed with a greater force over a further distance, effect repeated printing. Recently, electronic keyboard advancements have made these units more reliable and less costly than prior mechanical keyboards. However, it is desirous for the electronic keyboards to have the same tactile response to an operator and function in the same manner as the prior mechanical keyboards since most operators are trained on and are familiar with the prior mechanical keyboards.

It has been found that capacitively coupled electronic keyboards provide cost savings and reliable operation when compared to other electronic keyboards including those employing contact or ohmic switching elements. However, prior art approaches to provide an economical second switch to effect a repeated printing function in conjunction with a capacitive switch used to effect character selection and printing have resulted in unreliable devices or in devices which do not provide the same tactile response and which do not function in the same manner as prior mechanical keyboards which are familiar to typists. Examples of such approaches are described in the IBM Technical Disclosure Bulletin (TDB) of June, 1974 at page 164. They involve having the operator hold the key beyond a time out period to effect repeated key entry or the adding of an extra switch mechanism. The extra switch mechanism disclosed in the TDB article comprises a shorting clip located under certain keybuttons which is made to contact a printed circuit board when the key is fully depressed with a second force level. Although this device tactilely behaves like the prior mechanical keyboards, it is not reliable since the switch contacts are subject to bending, misorientation and/or contamination failure.

SUMMARY OF THE INVENTION

In order to overcome the aforenoted problems of the prior art and to provide a low cost, reliable, capacitive type electronic keyboard having an associated multiple switch assembly and which yields the tactile response and function of prior mechanical keyboards, a unique keyboard structure is employed which incorporates an ohmic switch assembly located immediately below the capacitive switches. A portion of the ohmic switch serves as a ground plane for the capacitive switches thereby reducing parasitic capacitance associated with the capacitive switches and shielding them from electrical noise generated by closure of the ohmic switch. A further portion of the switch assembly serves both to separate the ground plane and to spread the actuation force of the ohmic switch over a larger area thereby enhancing its reliability. The ohmic switch is sealed and located away from the keybuttons to thereby prevent contamination failure and contact bending problems. It is located in close proximity to the capacitive switch to reduce the profile height of the keyboard. The shared components of the two switches result in an inexpensive but yet reliable switch assembly. Accordingly, it is the principle object of the invention to provide an inexpensive yet reliable key actuated multiple switch assembly. A further object of the invention is to provide a key actuated multiple electronic switch assembly having tactile response and function similar to that of prior mechanical key actuators. A still further object of the invention is to provide a multiple switch assembly using a primary capacitive switch and a secondary ohmic switch, the switch assemblies each sharing parts to provide a compact and economic assembly. Another object of the invention is to provide a multiple switch assembly which is easy to assemble when manufactured. A yet further object of the invention is to provide a keyboard with multiple switch assemblies which are easy to interchange with single switch assemblies.

The foregoing and other features and advantages of this invention will be apparent from the following more particular description of the preferred embodiment of the invention as illustrated in the accompanying drawing.

IN THE DRAWING

FIG. 3 is a schematic illustration of a keyboard assembly.

FIG. 5 is a schematic illustration of a portion of the diaphragm switch card.

FIG. 6 is an illustration of the diaphragm switch card.

DETAILED DESCRIPTION

Figure 1:
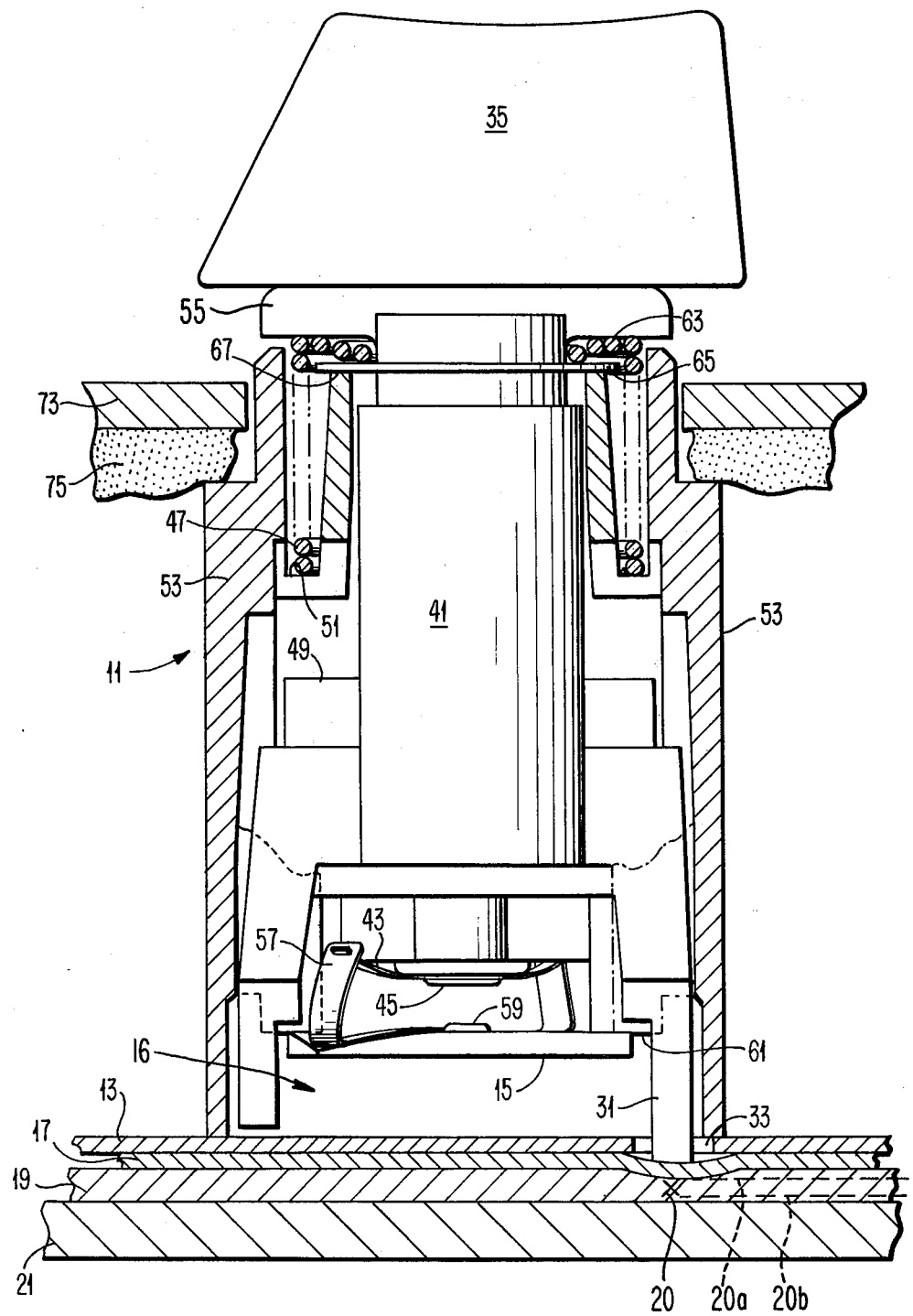
FIG. 1 is a cross-section view of a multiple switch key module in its actuated position.

Referring now to FIG. 1 of the drawing, a cross-section view of a multiple switch key module 11 in its actuated position is depicted. The key module 11 rests upon a pad card 13 which produces electrical signals indicating whether the fly plate 15 is resting upon the pad card 13 or is raised therefrom. As will be described hereafter, movement of the fly plate 15 away from the pad card 13 effects a change in sensed capacitance which is utilized to indicate actuation of the key module 11. The various elements to be described which effect the change in sensed capacitance will be referred to as a capacitive switch 16. When the key module 11 forms part of a keyboard used in conjunction with a typewriter, the signal indicates that an associated character should be printed or that an associated function be performed.

Located immediately under the pad card 13 is a layer 17 of dielectric material. A diaphragm switch card 19 is located under layer 17 and the diaphragm switch card 19 rests upon the machine frame 21. As will be described, the diaphragm switch card 19 includes a solid conductor ground plane surface 20a covering the entire area under the pad card 13. This surface 20a serves as a ground plane for the capacitive switches 16 and prevents the ohmic switch 20 of the diaphragm switch card 19 from disturbing the uniformity of the drive to sense capacitance of the pad card 13. Additionally, the diaphragm switch card 19 includes a second conductive surface 20b separated from the ground plane surface 20a having a switching voltage coupled thereto. Movement of the ground plane surface 20a into physical contact with the second conductive surface 20b effects a switch closure of the ohmic switch 20 and signal generation which will be described hereafter. This movement is effected by stem 31 of the key module 11 as it moves downward through the aperture 33 in the pad card 13 causing the layer 17 to deflect and further causing the ground plane surface 20a of the diaphragm switch card 19 to deflect into the second conductive surface 20b.

The key module 11 includes mechanisms to effect the lifting of the fly plate 15 from the pad card 13 and to effect the downward thrust of stem 31 to effect actuation of the ohmic switch 20. The key module 11 is constructed to provide three distinctive force levels which resist the downward depression of the associated keybutton 35. A first low force level is provided to resist movement of the keybutton 35 downward through a first small initial distance called the pretravel distance. This provides a tactile input to the operator that the keybutton 35 is moving downward. The operator further knows that key actuation will not occur during movement through this initial distance. After the pretravel distance has been traversed, further downward motion of the keybutton 35 is met with greater resistive force indicating to the operator that key actuation will take place during this movement. It is during this movement of the keybutton 35 that the fly plate 15 moves from the pad card 13. During normal typing, once key actuation has taken place, the operator releases the key and strikes further keybuttons to effect further printing. However, for example, where it is desirous to have repeated printing of the same symbol, the keybutton 35 is moved still further downward to thereby effect closure of the ohmic switch 20. This further downward motion is resisted by a third level of force. The mechanisms which effect the various resistant forces and which cause actuation of the key module 11 will now be described.

Figure 2:
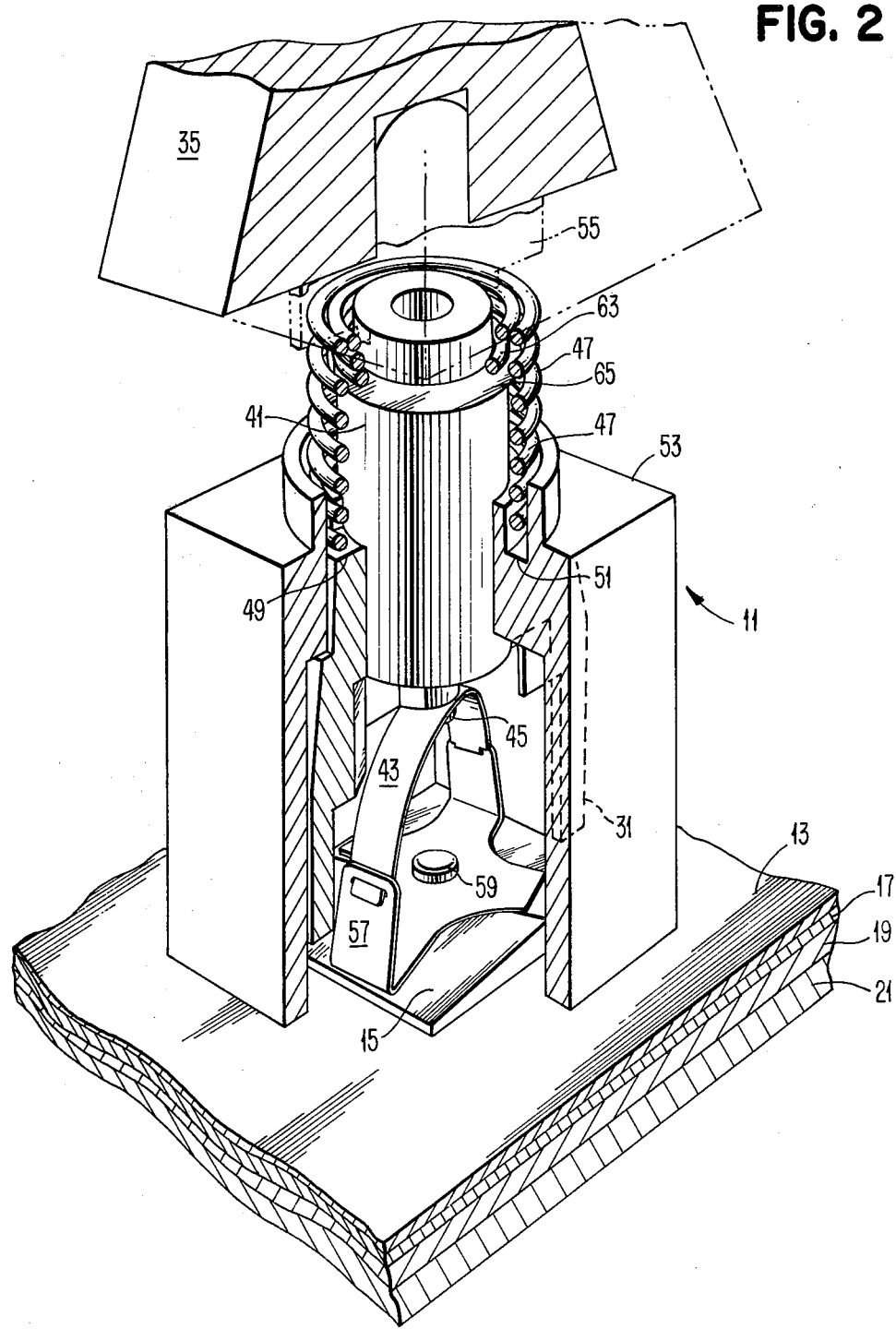
FIG. 2 is a perspective sectioned view of a multiple switch key module in its unactuated position.

Referring now to FIG. 2 of the drawing, a perspective sectioned view of a multiple switch key module 11 in its unactuated position is depicted. Initial operator depression of the keybutton 35 effects downward motion of the key stem 41. Downward movement of the key stem 41 effects corresponding downward motion of the beam spring 43, physically attached thereto by the boss surface 45 of the key stem 41. As it moves downward, the beam spring 43 provides a resistive force to such downward motion. This force is in the order of 0.3 to 0.7 ounces. Once the key stem 41 has traversed a distance of approximately 35 thousandths of an inch, the compression spring 47 which has been moving with the key stem 41 as it rests partially upon surface 49 thereof bottoms out on the slot surface 51 of the housing 53. At this time, after the pretravel distance has been traversed, further downward movement of the keybutton 35 causes the compression spring 47 to compress between the keybutton support 55 and the slot surface 51 thereby adding a resistive force to that being supplied by the beam spring 43. The combined force is in the order of 2.1 to 2.8 ounces. Further downward motion causes the beam spring 43 to approach its dead center position and slight motion beyond the dead center position effects a lifting force by the fly spring 57 and beam spring 43. The upward movement of the fly spring 57 causes the fly plate 15 attached to the fly spring 57 by the snap nut 59 to move away from the surface of the pad card 13. The total keybutton distance traversed is about 110 thousandths of an inch to the trip point.

Referring once again to FIG. 1 of the drawing, the fly plate 15 is shown in its raised position. When it moves to its raised position, the fly plate 15 contacts a stop surface 61 of the housing 53 preventing further upward movement thereof should the key stem 41 be further depressed. Further, the stop surface 61 fixes the up position of the fly plate 15 to thereby create a uniform electrical signal when the position of the fly plate 15 is sensed. Once the fly plate 15 has transferred to its upward position, further depression of the keybutton 35 may be effected in order to close the ohmic switch 20 of the diaphragm switch card 19. Such further depression of the keybutton 35 causes the key stem 41 and the stem 31 forming a portion thereof to move further in a downward direction. This movement is resisted by a force supplied by the compression spring 47 and a further force supplied by a conical compression spring 63.

The conical compression spring 63 rests upon a washer 65 which slides on the key stem 41. After the key stem 41 has traveled approximately one hundred sixty thousandths of an inch, the washer 65 bottoms upon a surface 67 of the housing 53. At this time, the conical compression spring 63 starts providing its resistive force as it compresses. The additive force of the conical compression spring 63 and the compression spring 47 is approximately 18 to 30 ounces. The stem 31 contacts the layer 17 after about forty thousandths of downward travel after the conical compression spring 63 is engaged. After about two hundred thousandths downward travel of the keybutton 35, the ohmic switch 20 of the diaphragm switch card 19 transfers thereby providing a second output electrical signal.

Upon release of the keybutton 35 by the operator, the conical compression spring 63 and the compression spring 47 cause the key stem 41 to move upwardly. Once the over center position of the beam spring 43 attached to the key stem 41 is reached, the spring force stored therein along with the spring force of the compression spring 47 effect return of the system to its initial position as depicted in FIG. 2.

Referring now to FIG. 3 of the drawing, a schematic illustration of a keyboard assembly 71 is depicted. The keyboard assembly 71 comprises a plurality of key modules 11 which rest upon the pad card 13. The key modules 11 may be identical to one another or some may have the stem 31 of FIG. 1 removed along with the conical compression spring 63 and washer 65. Additionally, the keyboard assembly 71 includes the layer 17, the diaphragm switch card 19 and the frame 21 which serves to support the keyboard assembly 71. Further, a key plate 73 is employed to support the key modules 11 and includes a foam layer 75 to help reduce acoustic noise and to prevent dirt contamination. The foam layer 75 also holds the key modules 11 against the pad card 13 to assure constant and uniform spacing of the fly plate 15 (FIG. 1) from the pad card 13. The keybuttons 35 are attached to the keybutton support 55 after the keyboard assembly 71 has been put together. As depicted, each key module 11 rests over a sense pad 77 and a coupling pad 79 which are printed circuit elements on the pad card 13. The electrical circuits formed by these sense pads 77 and coupling pads 79 will now be described.

Figure 4:
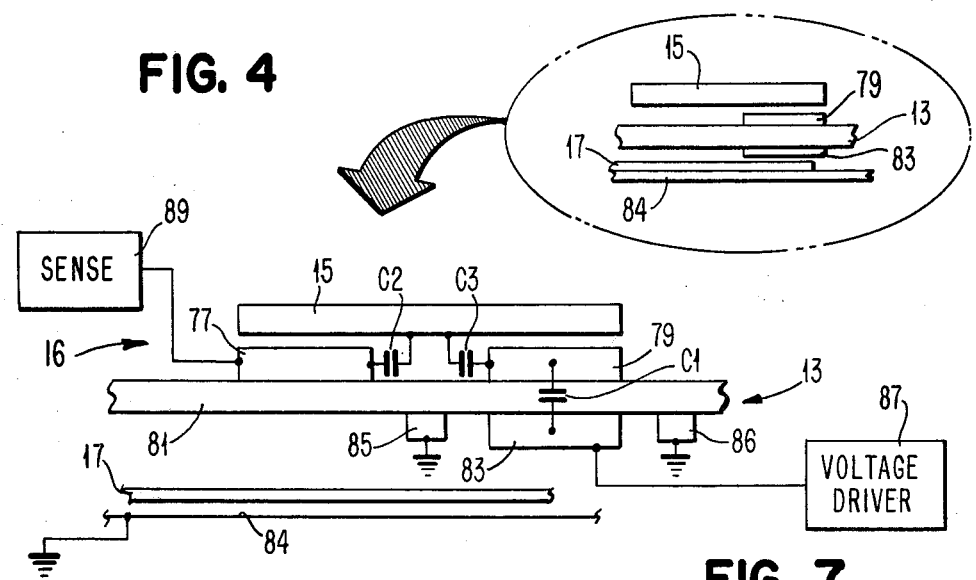
FIG. 4 is a schematic illustration of a portion of the pad card and ground plane.

Referring now to FIG. 4 of the drawing, a schematic illustration of a portion of the pad card 13 and ground plane 84 is depicted. The pad card 13 includes a substrate 81 made of an insulating material such as an epoxy-fiberglass type material. Located on the substrate 81 are plural sense pads 77, coupling pads 79 and drive pads 83, one each of which are illustrated. The fly plate 15 of a key module 11 of FIG. 1 rests above a corresponding sense pad 77 and coupling pad 79 separated by an epoxy insulating layer (not shown). The fly plate 15 is made of a conductive plastic material such as graphite impregnated nylon while the sense pad 77, coupling pad 79 and drive pad 83 are made of copper. The layer 17 of dielectric material and a ground plane 84 are located below the pad card 13. Additionally, a ground shield 85 and a ground shield 86 each made of copper are located adjacent the drive pad 83 on the pad card 13.

In the structure depicted, there exists coupling capacitance C1 between the coupling pad 79 and the drive pad 83, coupling capacitance C2 between the fly plate 15 and the sense pad 77 and coupling capacitance C3 between the coupling pad 79 and the fly plate 15. The layer 17 of dielectric material and the ground plane 84 are essential to reduce to a minimal value the parasitic capacitance between the various switch pads 77–83 and switch elements including fly plates 15.

In order to sense the location of the fly plate 15 and hence whether the keybutton 35 has been depressed, a voltage driver 87 is caused to periodically supply a voltage pulse to the drive pad 83. This voltage pulse causes current to flow from the sense pad 77 to the sensing device 89. This current may be represented by the equation: $I = CdV/dt$; where $dv/dt$ defines the voltage transition of the voltage driver 87 and C is given by the equation: $1/C = 1/C1 + 1/C2 + 1/C3$. In the device depicted, the capacitance changes from about 4 picafarads to about 0.4 pica-farads as the fly plate 15 is raised thereby changing coupling capacitance C2 and C3.

Further, it must be kept in mind that plural adjacent capacitive switches 16 exist on the pad card 13, one for each key module 11. Since a common driver having sixteen outputs and a common sensing device 89 having four inputs is employed in conjunction with the keyboard assembly 71, it is necessary that each capacitive switch 16 associated with each key module 11 generate approximately the same output signal. The ground shields 85 and 86 located about the periphery of each drive pad 83 serve to shield the drive pads 83 of adjacent capacitive switches 16 from one another. As described, the ground plane 84 is located in close proximity to the pad card 13 and serves to reduce parasitic capacitance and insures uniformity of each capacitive switch 16 since it is coextensive with the pad card 13 and presents the same reference over the entire pad card 13. The driven 87 and sensing device 89 are similar to the ones described in U.S. Pat. No. 3,786,497 and in Defensive Publication No. T904,008.

As indicated previously, an ohmic switch 20 (FIG. 1) is located under the pad card 13 and is actuated by those key modules 11 having a stem 31 (see FIG. 1) associated therewith. The operation of this ohmic switch 20 will now be described.

Referring now to FIG. 5 of the drawing, a schematic illustration of a portion of the diaphragm switch card 19 is depicted. The diaphragm switch card 19 includes a grounded upper element 91 corresponding to ground plane surface 20a of FIG. 1, an insulating separator 92 and a lower element 93 corresponding to conductive surface 20b of FIG. 1 having a source of voltage potential applied thereto. The separator 92 has apertures 95 formed therein corresponding to the location where the stem 31 (see FIG. 1) may effect depression of the upper element 91. When the upper element 91 physically contacts the lower element 93, ground potential is applied to the lower element 93 causing the sensing device 97 to sense the change in voltage level and generate a corresponding signal to be used by a logic unit or the like. This signal may be used to cause continued cycling of a printer or used to place a word processing system into a special mode of operation (e.g., center text, justify text, etc.).

With reference to FIG. 6 of the drawing, an illustration of the diaphragm switch card 19 shows the lower element 93, the separator 92, and the upper element 91. The upper element 91 comprises a thin sheet of polyethylene terephthalate 98 having a carbon coated surface or ground plane 84 thereon. This surface 84 is electrically connected to ground and forms a ground plane 84 for the pad card 13 of FIG. 4 as previously described as well as serving as a portion of the upper switch element 91 of the ohmic switch 20 of FIG. 5.

The separator 92 may also be made from polyethylene terephthalate and has apertures 95 located therein at positions corresponding to those key modules 11 having a stem 31 (see FIG. 1). The lower element 93 includes a rigid circuit board 100 having plated copper conductive pads 101 located thereon corresponding to those locations where the apertures 95 exist. A voltage is applied to these copper pads 101 as described with respect to FIG. 5 of the drawing. Switching is effected upon the carbon coated surface 84 contacting a copper pad 101 thereby grounding it. It is noted that multiple sensing circuits could be individually coupled to individual copper pads 101 to provide unique output signals for each corresponding keybutton 35 or groups of keybuttons 35 or a single sensing circuit could be used for all keybuttons 35.

Referring once again to FIG. 3 of the drawing, the operation of the switches located on the pad card 13 and those located on the diaphragm switch card 19 have been described. As previously indicated, the layer 17 of dielectric material is located between the pad card 13 and the diaphragm switch card 19. This material may be polyvinyl chloride having a dielectric constant of approximately 3.5 to 4 and a durometer of approximately shore equal 80. The selection of the dielectric constant is important to insure minimal parasitic capacitance as previously explained. The durometer is important to provide a proper tactile feel as well as proper flexing as the stem 31 (see FIG. 1) effects actuation. As noted, this layer 17 serves both to insure reduction of the parasitic capacitance and serves as a force spreader for the ohmic switch 20. That is, with reference to FIG. 1, as the stem 31 moves downward, it causes the layer 17 to deflect into the ohmic switch 20 causing force to be applied thereto over a greater surface area to thereby cause a greater contact area of the switching surface 20a and 20b.

Figure 7:
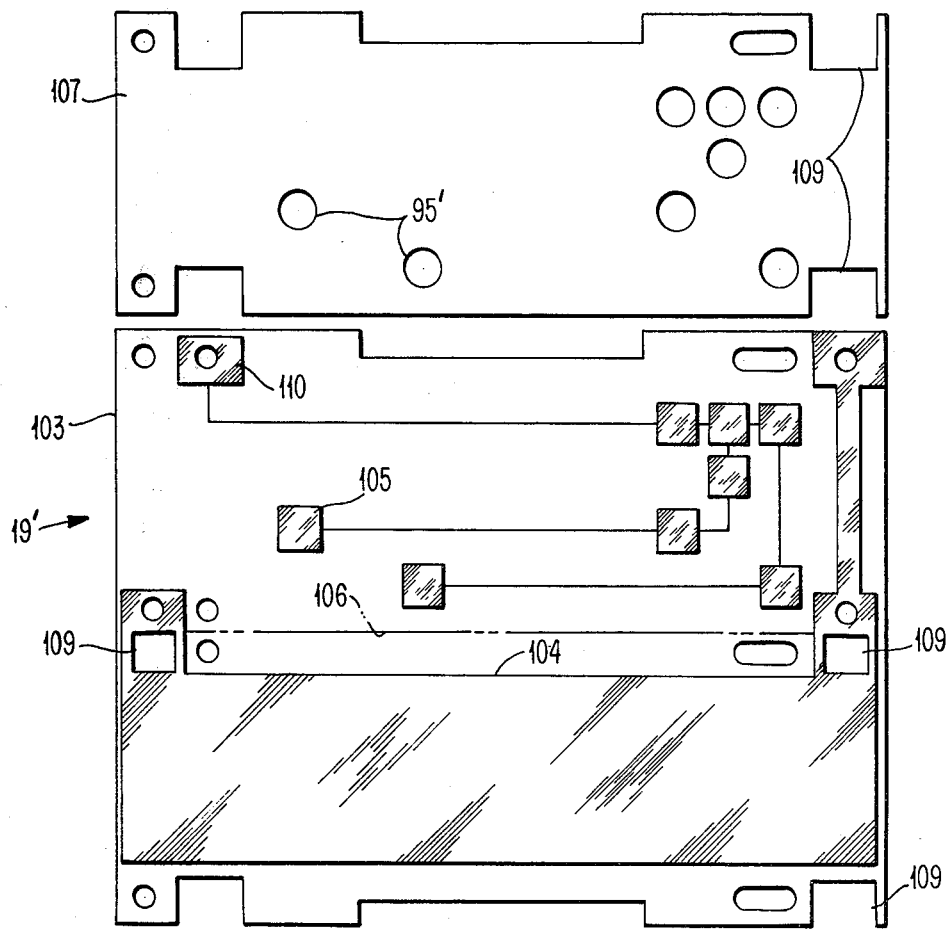
FIG. 7 is an illustration of an alternate diaphragm switch card.

Referring now to FIG. 7 of the drawing, an illustration of an alternate diaphragm switch card construction is depicted. The diaphragm switch card 19' includes a polyethylene terephthalate substrate 103 which supports both a carbon coated surface 104 and a plated copper land pattern 105. The substrate 103 is folded along line 106 and a separator layer 107 having apertures 95' is inserted between the fold. The switch functions as described with that of FIG. 6 and the carbon coated surface 104 forms both an ohmic switch element and a ground plane for the capacitive switches.

Referring once again to FIG. 4 of the drawing, it is noted that the ground potential of the ground plane 84 and the ground potential of the ground shields 85 and 86 must be at the same potential. Thus, it is necessary to insure a good physical connection between the ground shields 85 and 86 located on the pad card 13 and the ground plane 84 of the ohmic switching member. Referring again to FIG. 7, this connection can be made by a metallic connection through the apertures 109. The voltage contact is made at the contact surface 110.

ASSEMBLY

Referring once again to FIG. 3 of the drawing, the keyboard assembly 71 is assembled by placing key modules 11 over the proper locations of the pad card 13. The key modules 11 may either be of the type shown in FIGS. 1 and 2 having stems 31 extending into apertures 33 or of the type without such a stem. Once the key modules 11 are so assembled on the pad card 13, the key plate 73 is placed on the pad card while the layer 17 and the diaphragm switch card 19 and the frame 21 are assembled thereunder. A conductive connector 119 is connected through mating holes 120–123 and 124–127.

OPERATION

Referring again to FIG. 1 of the drawing, depression of the keybutton 35 causes the stem 41 to move in a downward direction forcing the beam spring 43 to also move in a downward direction. Once a pretravel distance has been passed, the compression spring 47 adds a further resistive force to that of the beam spring 43 to the downward motion of the keybutton 35. When the beam spring 43 reaches its over center position, it and the fly spring 57 cause the fly plate 15 to move away from the pad card 13. Continued downward motion causes the conical compression spring 63 to resist the downward movement. Further keybutton 35 depression causes the stem 31 to force the layer 17 against the upper surface of the diaphragm switch card 19. Eventually, an ohmic switch 20 on the diaphragm switch card 19 is made providing an electrical output signal.

With reference to FIGS. 4 and 5 of the drawing, movement of the fly plate 15 away from the pad card 13 changes the capacitance C2 and C3. This change in capacitance is sensed by the sensing device 89 upon the application of the voltage pulse to the drive pad 83 by the voltage driver 87. A signal thusly generated by the sensing device 89 may be utilized to effect printing when the device is used in conjunction with a typewriter. Thus, a particular character associated with each key module 11 is caused to be printed upon the depression of its associated keybutton 35. The output of the sensing device 89 could also be used to effect a typing function such as, for example, spacing, indexing, carriage return, etc.

Depression of the keybutton 35 of FIG. 1 to its lowermost position causes the grounded upper switching element 91 to deflect through the aperture 95 of the separator 92 thereby grounding out the lower element 93 of the diaphragm switch card 19. This action is sensed by sensing device 97 and provides a continuous output signal as long as the keybutton 35 of FIG. 1 is held in this position. The signal may be utilized by a logic unit to effect the continued cycling of the printing mechanism to effect printing of the character selected by the capacitive switching element. It could also be utilized to effect a unique machine function such as the placement of the typewriter into a special mode of operation (e.g., justification, centering, etc.).

It is to be noted that the type of capacitive switch construction may vary. That is, a single buckling spring attached to a fly plate could be employed in lieu of a beam spring-fly spring combination as described herein. Such a buckling spring is described in U.S. Pat. No. 4,118,611.

While the invention has been particularly shown and described with reference to the preferred embodiment thereof, it will be understood by those skilled in the art that the foregoing and other changes in form and detail may be made therein with department from the spirit and scope of the invention.

What is claimed is:

1. A keyboard switch assembly comprising:
 a plurality of manually movable keys;
 a capacitive switch assembly including a circuit board having individual circuit elements associated with individual keys, plural members each responsive to movement of an associated keybutton for moving relative to the associated individual circuit elements, capacitive sensing means for sensing a change in relative position between individual ones of said plural members and said associated individual circuit elements;
 a contact switch located below said circuit board and including a grounded planar member forming a first switch member and a ground plane electrical shield for said capacitive switch assembly, a second switch member having an electrical potential applied thereto, sensing means for sensing contact between the first and second switch members; and
 means extending through said circuit board and responsive to further movement of an associated keybutton for causing contact between said first and second switch members.

2. The keyboard switch assembly set forth in claim 1 further comprising:
 first individual means each for resisting movement of each of said associated keybuttons over a first pretravel distance;
 second individual means each for resisting further the movement of each of said associated keybuttons over a second distance following said pretravel distance; and
 third individual means each for resisting the movement of each of said associated keybuttons over a third distance following said second distance.

3. The keyboard switch assembly set forth in claim 2 wherein said third distance of keybutton travel occurs following the change in relative position between an associated one of said plural members and its associated individual circuit elements.

4. The keyboard switch assembly set forth in claim 1 further comprising a planar electrical insulating member located between said circuit board and said contact switch for reducing parasitic capacitance of said capacitive switch assembly;
 said means extending through said circuit board contacting said insulating member upon said further movement of said associated keybutton causing said insulating member to apply a force over a large contact area to cause contact between said first and second switch members.

5. The keyboard switch assembly set forth in claim 1 wherein said grounded planar member being essentially continous in the area below said capacitive switch assembly.

6. A keyboard switch assembly comprising:
a first capacitive switch circuit actuated upon motion of a key;
a second switch circuit sequentially actuated thereafter upon further motion of said key;
said switch assembly including a common element serving as a ground plane electrical shield for the first capacitive switch circuit and as a switch element for the second switch circuit whereby electrical noise introduced by closure of the second switch circuit and extraneous electrical signals are shielded from the first capacitive switch circuit by the common element, said common element further acting to reduce parasitic capacitance in said first capacitive switch circuit.

7. The keyboard switch assembly set forth in claim 6 further comprising:
a planar electrical insulating member located between said common element and the reamainder of said capacitive switch circuit for reducing the parasitic capacitance of said first capacitive switch circuit and for deflecting into said common element upon said further motion of said key to effect actuation of said second switch circuit.

8. The keyboard switch assembly set forth in claim 6 wherein said common element being an essentially continuous metal member.

* * * * *